(12) United States Patent
Seamons et al.

(10) Patent No.: US 11,133,177 B2
(45) Date of Patent: Sep. 28, 2021

(54) OXIDATION REDUCTION FOR SIOC FILM

(71) Applicant: Applied Materials, Inc., Santa Clara, CA (US)

(72) Inventors: Martin Jay Seamons, San Jose, CA (US); Michael Wenyoung Tsiang, Fremont, CA (US); Jingmei Liang, San Jose, CA (US)

(73) Assignee: APPLIED MATERIALS, INC., Houston, TX (US)

(*) Notice: Subject to any disclaimer, the term of this patent is extended or adjusted under 35 U.S.C. 154(b) by 213 days.

(21) Appl. No.: 16/673,943

(22) Filed: Nov. 4, 2019

(65) Prior Publication Data
US 2020/0203154 A1 Jun. 25, 2020

Related U.S. Application Data

(60) Provisional application No. 62/783,200, filed on Dec. 20, 2018.

(51) Int. Cl.
*H01L 21/02* (2006.01)
*C23C 16/50* (2006.01)
(Continued)

(52) U.S. Cl.
CPC ...... *H01L 21/02126* (2013.01); *C23C 16/045* (2013.01); *C23C 16/401* (2013.01);
(Continued)

(58) Field of Classification Search
CPC ......... H01L 21/02211; H01L 21/02216; H01L 21/02274; H01L 21/02126;
(Continued)

(56) References Cited

U.S. PATENT DOCUMENTS 9,412,581 B2 * 8/2016 Thadani ............ H01L 21/02271
2011/0034039 A1 2/2011 Liang et al.
(Continued)

FOREIGN PATENT DOCUMENTS

KR 10-2015-0050432 A 5/2015
KR 10-2017-0035635 A 3/2017

OTHER PUBLICATIONS

International Search Report dated Mar. 11, 2020 for Application No. PCT/US2019/060785.

*Primary Examiner* — Savitri Mulpuri
(74) *Attorney, Agent, or Firm* — Patterson + Sheridan LLP; B. Todd Patterson (57) ABSTRACT

Embodiments described herein generally related to methods for forming a flowable low-k dielectric layer over a trench formed on a surface of a patterned substrate. The methods include delivering a silicon and carbon containing precursor into a substrate processing region of a substrate processing chamber for a first period of time and a second period of time, flowing an oxygen-containing precursor into a remote plasma region of a plasma source while igniting a remote plasma to form a radical-oxygen precursor, flowing the radical-oxygen precursor into the substrate processing region at a second flow rate after the first period of time has elapsed and during the second period of time, and exposing the silicon and carbon containing dielectric precursor to electromagnetic radiation for a third period of time after the second period of time has elapsed.

17 Claims, 4 Drawing Sheets

(51) Int. Cl.
*C23C 16/40* (2006.01)
*C23C 16/04* (2006.01)

(52) U.S. Cl.
CPC ........ *C23C 16/50* (2013.01); *H01L 21/02211* (2013.01); *H01L 21/02216* (2013.01); *H01L 21/02345* (2013.01)

(58) Field of Classification Search
CPC ............. H01L 21/02345; C23C 16/401; C23C 16/452; C23C 16/50; C23C 16/045
See application file for complete search history.

(56) References Cited

U.S. PATENT DOCUMENTS

| | | |
|---|---|---|
| 2015/0196933 A1 | 7/2015 | Manna et al. |
| 2016/0020089 A1 | 1/2016 | Thadani et al. |
| 2016/0093488 A1* | 3/2016 | Thadani ............ H01L 21/02126 438/786 |

* cited by examiner

OXIDATION REDUCTION FOR SIOC FILM

CROSS-REFERENCE TO RELATED APPLICATIONS

This application claims the benefit to U.S. Provisional Application No. 62/783,200, filed Dec. 20, 2018, which is incorporated by reference herein.

BACKGROUND

Field

Embodiments of the present disclosure generally relate to flowable gap-fill films and fabrication processes thereof, more specifically, to forming silicon oxycarbide (SiOC)-based flowable films and reducing oxidation therein.

Description of the Related Art

In fabrication of miniaturized semiconductor devices, including shallow trench isolation (STI), inter-metal dielectric (IMD) layers, inter-layer dielectric (ILD) layers, pre-metal dielectric (PMD) layers, passivation layers, and the like, it is necessary to fill high aspect ratio gaps with insulating materials. As feature sizes of transistors, as well as spaces between them, have gone down to 20 nm or below and thermal budgets are reduced, void-free filling of such minute and high aspect ratio features is becoming increasingly challenging. In one of the techniques that have been developed for filling gaps and trenches, dielectric precursors in a liquid phase are delivered into gaps and trenches, and then hardened into a dielectric film in a solid phase (referred to as flowable film or gap-fill film), conventionally by steam annealing, hot pressing, and sintering at high temperatures. In many instances the chemical structures in dielectric precursors used in the dielectric film forming process includes removable chemical groups, leaving behind pores in the hardened dielectric films or causing shrinkage of the dielectric films. Furthermore, the conventional hardening processes at high temperatures inevitably increase oxidization within the dielectric films. Therefore, a careful selection of chemical processing methods is needed to form flowable films that are soft having a low modulus and viscosity to ensure void-free filling of gaps and trenches and reduced oxidization for applications in devices, such as phase change memories and back end of line (BEOL) portions of integrated circuits.

Furthermore, there is a need for flowable films having improved mechanical properties, such as an improved wet etch rate WERR (<2:1), relative to thermal oxide, and a dielectric constant equal to or less than that of thermal oxide, and low internal stress.

SUMMARY

Embodiments described herein generally related to a substrate processing apparatus and a method of forming a dielectric layer on a surface of a substrate. Embodiments of the disclosure may further provide a method of forming a low-k dielectric flowable film over a trench formed on a surface of a patterned substrate. The method includes delivering a silicon and carbon containing precursor into a substrate processing region of a substrate processing chamber for a first period of time and a second period of time, flowing an oxygen-containing precursor into a remote plasma region of a plasma source while igniting a remote plasma to form a radical-oxygen precursor, flowing the radical-oxygen precursor into the substrate processing region at a second flow rate after the first period of time has elapsed and during the second period of time, and exposing the silicon and carbon containing dielectric precursor to electromagnetic radiation for a third period of time after the second period of time has elapsed.

Embodiments of the disclosure may further provide a method of forming a low-k flowable dielectric film over a trench formed on a surface of a patterned substrate, comprising delivering a silicon and carbon containing precursor at a first flow rate into a substrate processing region of a first substrate processing chamber for a first period of time and a second period of time, flowing an oxygen-containing precursor into a remote plasma region of a plasma source while igniting a remote plasma to form a radical-oxygen precursor, flowing the radical-oxygen precursor into the substrate processing region at a second flow rate after the first period of time has elapsed and during the second period of time, and exposing the silicon and carbon containing precursor to electromagnetic radiation for a third period of time after the second period of time has elapsed while the patterned substrate is maintained at a temperature of between 40° C. and 500° C., wherein the electromagnetic radiation is provided at a first wavelength and at a first power.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Methods are described herein for forming a low-k dielectric flowable film on a patterned substrate. The low-k dielectric flowable film may be a silicon oxycarbide (SiOC)-based flowable film that contains silicon-carbon-oxygen (Si—C—O) bonds. At least the silicon and carbon constituents in the formed film come from a silicon and carbon containing precursor, which may also contain an amount of oxygen, while the reactive species required to form the low-k dielectric flowable film are provided from an oxygen-containing precursor activated in a remote plasma region.

In general, according to some embodiments of the disclosure, the methods may include delivering an organo-silane precursor (also referred to as a dielectric precursor, or silicon and carbon containing precursor) that includes silicon and carbon containing polymers (which may further contain oxygen) onto a patterned substrate, and cross-linking polymers within the dielectric precursor to form a SiOC-based flowable film on the patterned substrate. The methods may include curing the formed film at a low substrate temperature to increase the concentration of Si—O—Si bonds while reducing the concentration of oxygen incorporated within the formed film and maintaining the desirable properties of the formed film. Various conditions for the curing treatment are controlled to reduce oxygen incorporated within the film(s) formed on the patterned surface.

Figure 1:
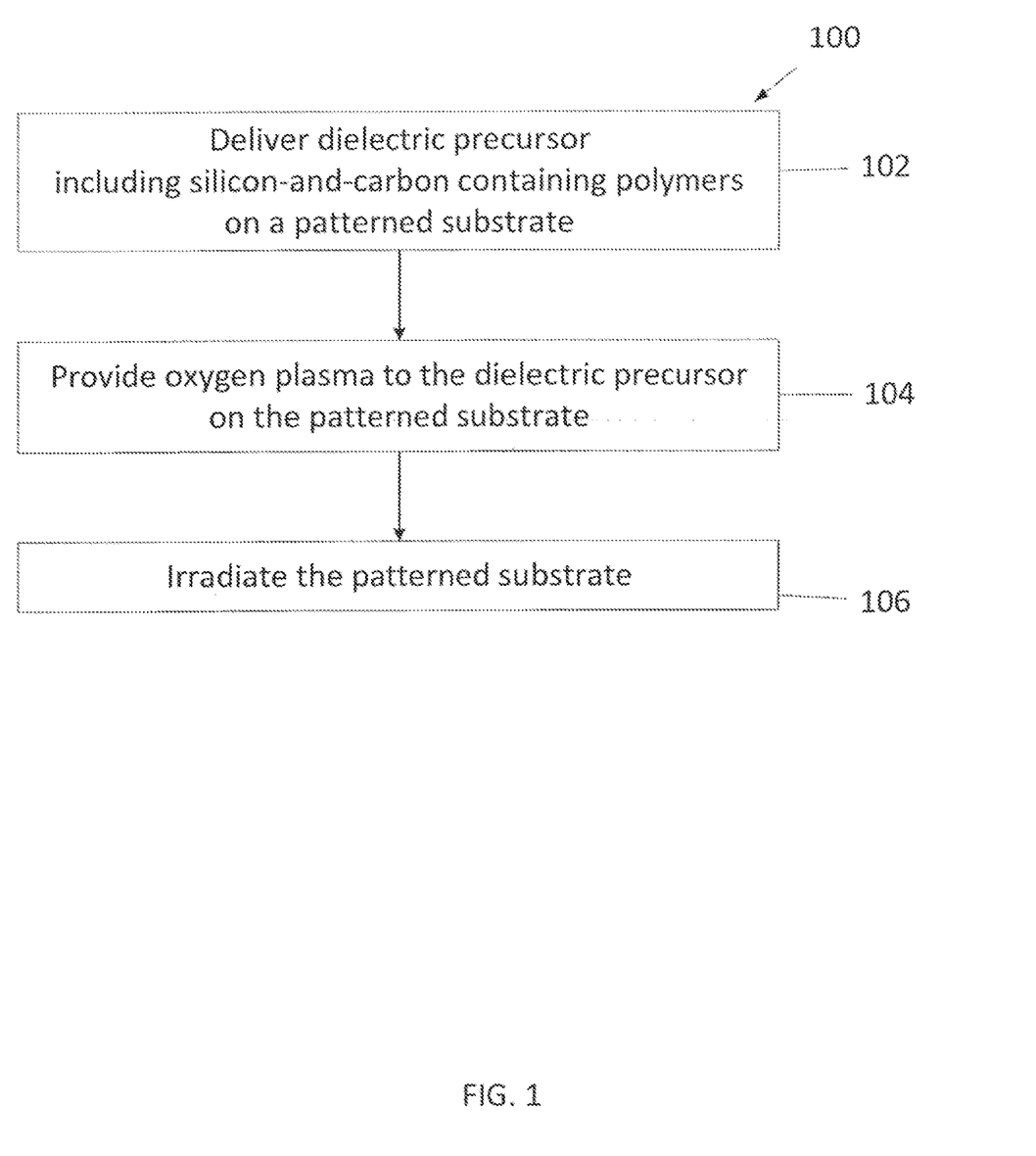
FIG. 1 is a flowchart showing selected steps in deposition systems of forming silicon oxycarbide (SiOC)-based flowable films and reducing oxidation therein according to one embodiment.

The processes described herein can be used to prevent or minimize the amount of oxidation of metal-containing interconnects formed on or within a patterned substrate and/or the oxidation of portions of a memory device due to an undesirable amount of oxygen that is typically found within a conventionally formed low-k dielectric flowable film. The undesirably large amount of oxygen within a conventionally formed low-k dielectric flowable film will tend to migrate to and then oxidize portions of these structures during one or more subsequent processing steps. The oxidation of metal-containing interconnects, which may contain titanium (Ti), titanium nitride (TiN), tantalum (Ta), tantalum nitride (TaN), tungsten (W), cobalt (Co), copper (Cu) and aluminum (Al), can increase line resistance and the contact resistance created between and within one or more formed interconnecting metal layers. The undesirable oxidation of various portions of a memory device, such as phase change memory devices, which include OTS (Ovonic threshold switch) material containing devices (e.g., BCTe, GeSiAsTe, GeAsSe, SeAsGeSi) and/or GST (GeSbTe, germanium-antimony-tellurium) containing devices, as it is being formed, can adversely affect electrical properties of the formed memory device layers, which can cause breakdown or poor electrical device performance. The methods of forming a flowable low-k dielectric layer described herein have significant advantages for use in "subtractive etch" interconnect layer formation processes where the flowable low-k dielectric layer is used to fill and electrically isolate various regions of one or more patterned metal layers, due to the significantly reduced propensity of the formed flowable low-k dielectric layer to oxidize the exposed portions of the patterned metal layers FIG. 1 is a flowchart illustrating a method 100 that includes various operations performed that are used to form a silicon oxycarbide (SiOC)-based flowable film and reducing oxidation therein on a surface of a substrate, according to one embodiment. A substrate, for example, may include metal substrates, such as aluminum and stainless steel, semiconductor substrates, such as silicon, silicon-on-insulator (SOI), gallium arsenide, glass substrates, and plastic substrates. A patterned substrate typically includes more than one gap, trenches, holes, vias, or the like, that is to be filled with low-k dielectric material.

In block 102, a dielectric precursor and a carrier gas are flowed into a processing chamber via a gas delivery device, such as a dual channel showerhead (DCSH) to deliver the dielectric precursor onto a substrate having a gap formed thereon in the absence of oxygen plasma.

In conventional flowable film forming processes, an oxygen containing plasma is first provided into a processing chamber, and then the dielectric precursor is delivered onto a surface of a patterned substrate disposed within the processing chamber to insert an oxygen atom into the Si—Si bonds within the dielectric precursor to expand the volume of the flowable film formed on the patterned surface. Thus, the excited oxygen ions and oxygen radicals in the plasma in the processing chamber inevitably increases oxygen concentration during the initial growth of the flowable film (i.e., as the dielectric precursor is delivered). The flowable film having increased oxygen concentration tends to oxidize materials in contact with the flowable film. In addition, the dielectric precursor, as delivered into the processing chamber, may experience collisions with excited oxygen ions and oxygen radicals, which can undesirably modify the molecular structures of the dielectric precursor.

In some embodiments of the disclosure provided herein, to reduce oxygen concentration within the overall flowable film and also generally preserve the molecular structures of the dielectric precursor during the initial growth of the flowable film, the dielectric precursor is delivered to the surface of the patterned substrate before the surface of the patterned substrate is exposed to the excited oxygen ions or oxygen radicals that are formed within a plasma.

In some embodiments of block 102, the delivery of the dielectric precursor to the surface of the patterned substrate includes setting the patterned substrate to a dual channel showerhead (DSCH) spacing of between about 500 mils and 3000 mils. The dielectric precursor is then delivered to the surface of the patterned substrate at a desired flow rate, such as a flow rate of between about 0.25 grams per minute (g/min) and about 3 g/min, which is also referred to herein as a per channel flow from the DSCH. A carrier gas, such as argon (Ar) or helium (He), may be flowed into the processing chamber at a flow rate between 250 sccm and about 5000 sccm per channel of the DSCH. The surface of the patterned substrate can be held at a reduced temperature of between about 40° C. and about 150° C., for example at about 80° C. A pressure of the processing chamber may be maintained between about 0.5 Torr and about 3.0 Torr. In some embodiments, the flow of the dielectric precursor can be initiated between about 1 and about 600 seconds, such as about 10 to 15 seconds before the next step, or block 104 which is discussed below, is initiated.

The dielectric precursor may include an organo-silane precursor that includes silicon and carbon containing polymers or silicon-carbon-and-oxygen containing polymers, which include repeated units of siloxane functional group (Si—O—Si). The silicon and carbon containing polymer may possess a Si—O to Si ratio of 1 or less than 3, according to some embodiments. These ratios correlate with the production of low-k dielectric flowable films using the methods described herein. The Si—O to Si ratio is calculated by counting the number of Si—O bonds in the silicon and carbon containing precursor and dividing by the number of silicon atoms in the silicon and carbon containing precursor. For example, the dielectric precursor may be octamethylcyclotetrasiloxane (OMCTS (see item (1) below)), which has a Si—O:Si ratio of 1, and have been found to correlate with an increased degree of flowability and a decreased dielectric constant. In some embodiments, the silicon and carbon containing precursor may be nitrogen-free to enable the production of nitrogen-free low-k dielectric.

(1)

The dielectric precursor OMCTS may be supplied into the processing chamber at a flow rate between about 0.25 grams per minute (g/min) and about 3 g/min per channel of the DSCH. The carrier gas, such as argon (Ar) or helium (He), may be flowed into the processing chamber at a flow rate between 250 sccm and about 5000 sccm per channel of the DSCH.

In some embodiments, the dielectric precursor is tetramethoxysilane (TMOS (see item (2)), $Si(OR)_4$).

(2)

The dielectric precursor TMOS may be supplied directly into the processing chamber at a flow rate between about 0.05 grams per minute (g/min) and about 1 g/min per channel of the DSCH. The carrier gas, such as argon (Ar) or helium (He), may be flowed into the processing chamber at a flow rate between 50 sccm and about 1000 sccm per channel of the DSCH. The dielectric precursor TMOS may be used in addition to the dielectric precursor OMCTS or by itself.

In some examples, the dielectric precursor may be other organo-silanes that include repeated units of siloxane functional group (Si—O—Si), such as tetramethylcyclotetrasiloxane, hexamethyldisiloxane, tetramethyldisiloxane, dimethyldisiloxane. In other examples, the dielectric precursor may be other organo-silanes that do not include repeated units of siloxane functional group (Si—O—Si). In some examples, the dielectric precursor may be other organo-silanes, such as dimethyldichlorosilane ($SiR_2Cl_2$ (see item (3)), (3)

In some other examples, the dielectric precursor may include other organo-silanes, such as polydimethylsiloxane (PDMS). The silicon and carbon containing polymers, such as PDMS, can have a low modulus and viscosity. Thus, the silicon and carbon containing polymer polymers may flow in and fill the gap as deposited. The silicon and carbon containing polymers further exhibit low-k dielectrics and chemical stability at low temperatures. However, silicon-and-carbon containing polymers may lose hydrogen and carbon and convert to silicon dioxide ($SiO_2$) in other fabrication processes at high temperatures.

In block 104, following the delivery of the dielectric precursor onto the surface of the patterned substrate, an oxygen plasma is provided along with a carrier gas (e.g., Ar, He) into the processing chamber to hydrophilize (i.e., insert hydroxyl groups (—OH) in) the dielectric precursor delivered onto the patterned substrate. As discussed above, the delivery of the oxygen containing plasma to the surface of the patterned substrate occurs after a desired period of time has elapsed from when the dielectric precursor was delivered to the surface of the patterned substrate. For example, the oxygen containing plasma is delivered to the surface of the patterned substrate between about 1 and about 1800 seconds, such as about 10 to 15 seconds, after block 102 has been initiated. Oxygen ($O_2$) radicals activated in the oxygen plasma provided into the processing region of the processing chamber causes the replacement of methyl groups R (—$CH_3$) with hydroxyl groups (—OH) in the delivered dielectric polymers. During the hydrophilization in block 104, the flow rate of oxygen radicals in the oxygen plasma may be reduced and the oxygen exposure time may be minimized to reduce oxygen concentration in an overall flowable film, while maximizing a rate of the hydrophilization.

The oxygen plasma can be formed in a remote plasma system (RPS) outside the processing chamber by the dissociation of an oxygen-containing precursor such as molecular oxygen ($O_2$), ozone ($O_3$), an nitrogen-oxygen compound (e.g., NO, $NO_2$, $N_2O$), a hydrogen-oxygen compound (e.g., $H_2O$, $H_2O_2$), a carbon-oxygen compound (CO, $CO_2$). The flow rate of the oxygen radicals may be between about 100 sccm and about 2000 sccm, such as 250 sccm and about 2000 sccm, per channel of the DSCH. The flow rate of the carrier gas (e.g., Ar, He) may be between about 0 sccm and about 10000 sccm, such as 500 sccm and about 6000 sccm, per channel of the DSCH. In one example, a ratio of the flow rate of oxygen ($O_2$) to the flow rate of the argon (Ar) provided to the remote plasma source (RPS) to form the oxygen radicals is between 0.05 and 5, such as a ratio between 0.1 and 4, or a ratio between 0.1 and 0.5, or even a ratio between 0.1 and 0.3. The oxygen radicals produced in a chamber plasma region may also be accompanied by ionized species formed in the plasma. In some cases, it may be desirable to combine the oxygen-containing precursor with a nitrogen-containing precursor or hydrogen-containing precursor in the remote plasma system. The oxygen radicals may include one or more of $O_2$, $H_2O$, $O_3$, $H_2O_2$, $N_2O$, NO or $NO_2$.

In some embodiments, a desired ratio of the dielectric precursor to the flow rate of the oxygen radicals and a desired ratio of the dielectric precursor to the total flow rate of a carrier gas (e.g., sum of all the argon or helium flowrates provided to the processing region from all of the different gas sources during processing) is also maintained during the processing performed within block 104. In one example, a ratio of the flow rate of octamethylcyclotetrasiloxane (OMCTS) to the flow rate of the oxygen radicals is between 0.05 and 0.50, such as a ratio between 0.06 and 0.43, and a ratio of the flow rate of octamethylcyclotetrasiloxane (OMCTS) to the total flow rate of the argon (Ar) is between 0.01 and 0.08, such as a ratio between 0.02 and 0.07. In another example, in which TMOS is provided in addition to OMCTS, a ratio of the flow rate of OMCTS to the flow rate of the oxygen radicals is between 0.05 and 0.50, such as a ratio between 0.06 and 0.43, a ratio of the flow rate of OMCTS to the total flow rate of the argon (Ar) is between 0.01 and 0.08, such as a ratio between 0.02 and 0.07, and a ratio of the flow rate of OMCTS to the flow rate of TMOS is between 3.0 and 11.0.

In block 106, following the hydrophilization of the dielectric precursor on the patterned substrate, the dielectric precursor is cured, causing cross-linking between polymers in the dielectric precursor, to form a silicon oxycarbide (SiOC)-based flowable film. In some embodiments, the curing process is performed in which electromagnetic radiation (e.g., UV radiation) at a controlled irradiation power and wavelength is provided to the dielectric precursor that are maintained at a controlled processing temperature for a desired treatment duration. In some embodiments, the cross-linking between the polymers may occur in the same deposition chamber without a UV radiation due to a thermal energy (e.g., the surface of the patterned substrate may be at a temperature of between about 40° C. and about 150° C., for example at about 80° C.). Alternatively the cross-linking may occur in another chamber at temperatures of between about 150° C. and about 500° C. at pressures of between about 1 and about 600 Torr. In some embodiments, the cross-linking between the polymers occurs due to both the thermal energy and the UV energy with UV radiation. The process in block 106 is performed to minimize the concentration of $H_2O$ generated by the silanol condensation reaction at any instant of time during the process, to prevent the undesirable oxidation of the various features formed on or within the patterned substrate. It is believed that conventional stabilizing processes, such as thermal stabilizing processes, and/or processes that do not control the concentration of $H_2O$ generated and the processing temperature will cause undesirable oxidation of portions of the patterned substrate, due to the generation of excessive amounts of $H_2O$ and/or providing too much thermal or UV energy to the reaction products which causes the rapid diffusion of the oxygen containing components within the formed layer and the rapid oxidation of the underlying materials.

As noted above, when hydroxyl groups (—OH) in the silanol groups (Si—OH) in adjacent dielectric polymers react, the adjacent dielectric polymers cross-link by forming Si—O—Si bonds and water ($H_2O$) is generated. The cross-linking of polymers in the dielectric precursor provided in block 106 reduces the concentration of oxygen while increasing the concentration of Si—O—Si bonds in the dielectric polymers. Typically, while not intending to be limiting, the hydrophilizing and cross-linking of polymers in the dielectric precursor (blocks 104 and 106) are performed in a different processing chamber from the processing chamber in which the delivery of the dielectric precursor (block 102) was performed. In general, the set of operations (e.g. blocks 102-106) may be repeated multiple times to form an overall thicker layer of the low-k dielectric flowable film that has a reduced concentration of oxygen throughout the formed multilayer containing low-k dielectric flowable film.

The UV radiation of the dielectric precursor may be performed while an inert gas is provided into the processing chamber. The flow rate of the inert gas (e.g., Ar, or He) may be between about 1000 sccm and about 25000 sccm per channel of the DSCH. The UV irradiation inevitably provides energy to the dielectric precursor previously delivered to the patterned substrate, which causes the reaction products (e.g., $H_2O$) to be generated due to the exposure of the dielectric precursor to the UV radiation. Thus, the UV irradiation of the dielectric precursor must be controlled such that the irradiation is sufficient to cross-link polymers in the dielectric precursor while preventing the low-k dielectric flowable film from prematurely becoming solid and preventing the heated water vapor from oxidizing underlying metals in the patterned substrate. Durations of UV radiation may be between about 10 seconds and about 30 minutes, for example about 180 seconds. The wavelengths of suitable UV light may be between 240 nm and 600 nm. UV lamp power for the UV radiation may be at intensity up to 20 W/cm$^2$. The temperature of the surface of the patterned substrate during the UV radiation may be maintained between about 150° C. and about 500° C. for a semiconductor substrate, such as between about 150° C. and about 400° C., or between about 250° C. and about 385° C. A pressure in the processing chamber during the UV radiation may be maintained at less than 50 Torr, such as between about 5 Torr and about 50 Torr. The dielectric precursor such as PDMS polymers are heat-resistant and remain flowable, soft, and malleable.

Figure 2:
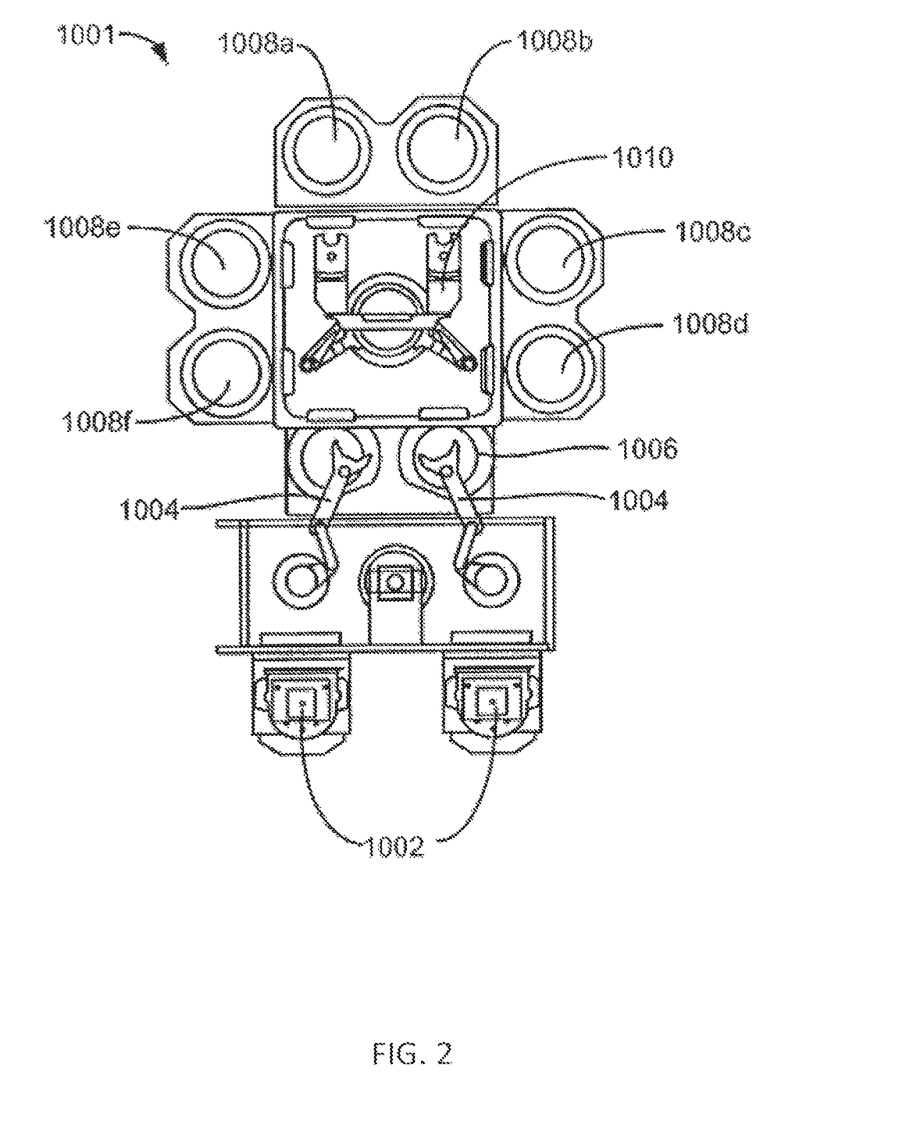
FIG. 2 is a schematic view of a system of deposition and curing chambers according to one embodiment.

Embodiments of the deposition systems may be incorporated into larger fabrication systems for producing integrated circuit chips. FIG. 2 shows one such system 1001 that includes deposition and curing chambers, according to one embodiment. In FIG. 2, a pair of front opening unified pods (FOUPs) 1002 supply substrates (e.g., 300 mm diameter wafers) that are received by robotic arms 1004 and placed into a low pressure holding area 1006. A second robotic arm 1010 may be used to transport the substrate between the lower pressure holding area 1006 and the processing chambers 1008*a-f*.

The processing chambers 1008*a-f* may include one or more system components for depositing, curing and/or etching a flowable dielectric film on the substrate. In some embodiments, two pairs of processing chambers (e.g., 1008*c-d* and 1008*e-f*) may be used to deposit a flowable dielectric film on the substrate, while the third pair of chambers (e.g., 1008*a-b*) may be used for UV curing of the deposited dielectric film. Thus, in some embodiments, the system 1001 is adapted to perform method 100 by first performing blocks 102 and 104 of the method 100 simultaneously on two substrates that are positioned in one of the two pairs of processing chambers (e.g., 1008*c-d* or 1008*e-f*), and then, second, transferring the substrates from the one of the two pairs of processing chambers to a third pair of processing chambers (e.g., 1008*a-b*) where block 106 is performed on the substrates.

In some embodiments, all three pairs of chambers (e.g., 1008*a-f*) may be used to deposit and cure a flowable dielectric film on the substrate. In some alternate embodiments, the system 1001 is adapted to perform method 100 by sequentially performing all of the blocks 102-106 of the method 100 simultaneously on two substrates that are positioned in one of the two pairs of processing chambers (e.g., 1008*a-f*).

In addition, one or more of the processing chambers 1008*a-f* may be used as a wet treatment chamber. These processing chambers include a chamber for heating the flowable dielectric film in an atmosphere that includes moisture.

Figure 3A:
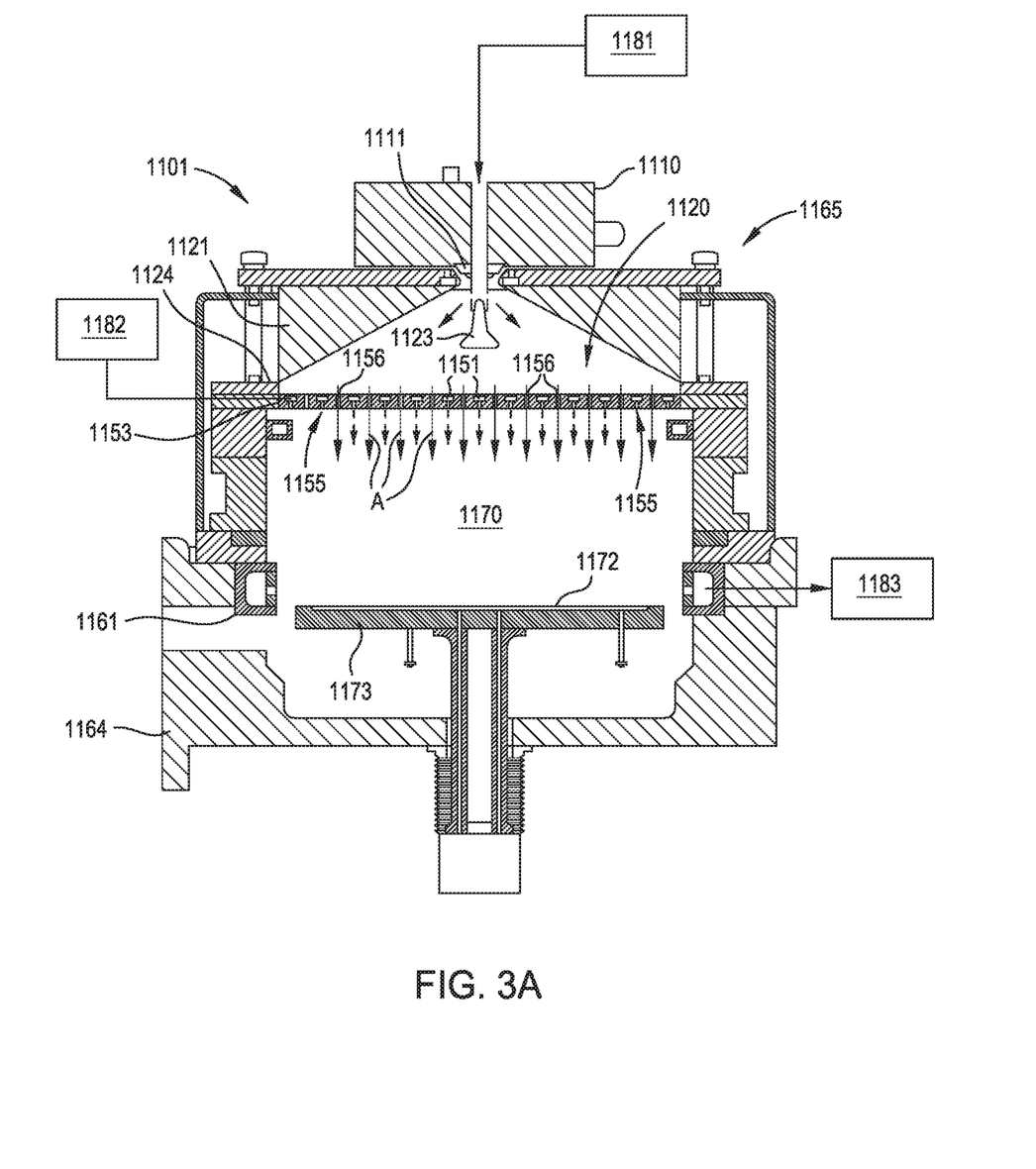
FIG. 3A is a schematic side cross-sectional view of a processing chamber according to one embodiment.

FIG. 3A is a schematic view of a processing chamber 1101 having a chamber body 1164 and lid assembly 1165, according to one embodiment. The lid assembly 1165 generally includes a remote plasma source 1110, a lid 1121, and a dual channel showerhead (DCSH) 1153. The remote plasma source (RPS) 1110 may process an oxygen containing precursor gas provided from an oxygen source 1181. The oxygen plasma formed in the RPS 1110 may be then delivered through a gas inlet assembly 1111 and baffle 1123, which are coupled to the lid 1121, and into a chamber plasma region 1120. A carrier gas such as argon (Ar), helium (He), and nitrogen (N₂) and/or a film-curing gas may be delivered into the chamber plasma region 1120 to remove an unwanted component from the growing or as-delivered film. A lid (that is a conductive top portion) 1121 and a dual channel showerhead (DCSH) 1153 are disposed with an insulating ring 1124 in between, which allows an AC potential to be applied to the lid 1121 relative to the DCSH 1153.

The DCSH 1153 is disposed between the chamber plasma region 1120 and a substrate processing region 1170 and allows plasma effluents (that are ionized or neutral derivatives of precursors or other gases and also referred to as radicals) present within the chamber plasma region 1120 to pass through a plurality of through-holes 1156 into the substrate processing region 1170, without directly exciting silicon and carbon containing precursors before they enter the chamber plasma region 1120. The flow of the plasma effluents is indicated by the solid arrows "A" in FIG. 3A. A substrate 1172 is disposed on a substrate support 1173 disposed within the substrate processing region 1170. The DCSH 1153 also has one or more hollow volumes 1151 which can be filled with a dielectric precursor (such as OMCTS and TMOS) provided from a precursor source 1182. The dielectric precursor passes from the one or more hollow volumes 1151 through small holes 1155 and into the substrate processing region 1170, bypassing the chamber plasma region 1120. The flow of the dielectric precursor is indicated by the dotted arrows in FIG. 3A. An exhaust ring 1161 is used to uniformly evacuate the processing region 1170 by use of an exhaust pump 1183. The DCSH 1153 may be thicker than the length of the smallest diameter of the through-holes 1156. The length of the smallest diameter 1150 of the through-holes may be restricted by forming larger diameter portions of through-holes 1156 partially through the DCSH 1153, to maintain a flow of plasma effluents from the chamber plasma region 1120 into the substrate processing region 1170. In some embodiments, the length of the smallest diameter of the through-holes 1156 may be the same order of magnitude as the smallest diameter of the through-holes 1156 or less.

In some embodiments, a pair of processing chambers (e.g., 1008c-d) in FIG. 2 (referred to as a twin chamber) may be used to deposit a flowable dielectric film on the substrate. Each of the processing chambers (e.g., 1008c-d) can have a cross-sectional structure of the processing chamber 1101 depicted in FIG. 3A. The flow rates per channel of the DCSH described above correspond to flow rates into each of the chambers (e.g., 1008c-d) via the corresponding DCSH 1153. The substrate 1172 may be transferred to another twin pair (e.g., 1008a-b) in vacuum for UV curing of the dielectric film following the deposition of the dielectric film on the substrate 1172.

Figure 3B:
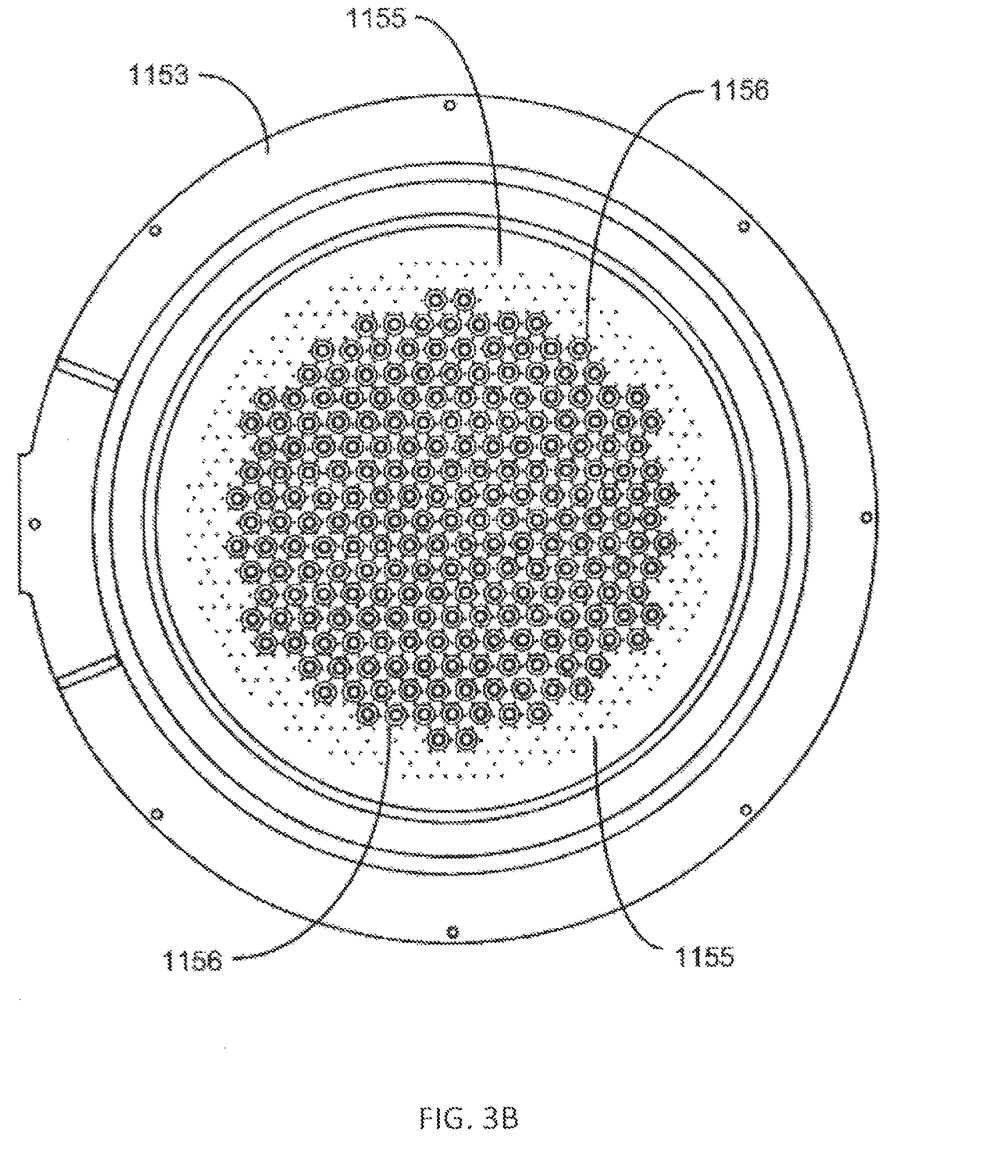
FIG. 3B is a schematic bottom view of the shower head according to one embodiment.

FIG. 3B is a schematic view of the DCSH 1153 according to one embodiment. The DCSH 1153 may deliver via through-holes 1156 the plasma effluents and the carrier gas present within the chamber plasma region 1120.

In some embodiments, the number of through-holes 1156 may be between about 60 and about 2000. Through-holes 1156 may have round shapes or a variety of shapes. In some embodiments, the smallest diameter 1150 of through-holes 1156 may be between about 0.5 mm and about 20 mm or between about 1 mm and about 6 mm. The cross-sectional shape of through-holes may be made conical, cylindrical or a combination of the two shapes. In some embodiments, the number of small holes 1155 used to introduce a dielectric precursor into the substrate processing region 1170 may be between about 100 and about 5000 or between about 500 and about 2000. The diameter of the small holes 1155 may be between about 0.1 mm and about 2 mm.

While the foregoing is directed to specific embodiments, other and further embodiments may be devised without departing from the basic scope thereof, and the scope thereof is determined by the claims that follow.

What is claimed is:

1. A method of forming a low-k flowable dielectric film over a trench formed on a surface of a patterned substrate, comprising:

delivering a silicon and carbon containing precursor at a first flow rate onto a surface of a patterned substrate disposed in a substrate processing region of a first substrate processing chamber for a first period of time and a second period of time;

flowing an oxygen-containing precursor into a remote plasma region of a plasma source while igniting a remote plasma to form a radical-oxygen precursor;

flowing the radical-oxygen precursor into the substrate processing region at a second flow rate after the first period of time has elapsed and during the second period of time;

transferring the patterned substrate from the first substrate processing chamber to a second substrate processing chamber after the second period of time has elapsed; and exposing the silicon and carbon containing precursor to electromagnetic radiation in the second substrate processing chamber for a third period of time after the second period of time has elapsed, to form a low-k flowable dielectric film over a trench formed on the surface of the patterned substrate, wherein the silicon and carbon containing precursor comprises octamethylcyclotetrasiloxane (OMCTS) tetramethylcyclotetrasiloxane (TMCTS), hexamethyldisiloxane (HMDSO), tetramethyldisiloxane (TMDSO), dimethyldisiloxane (DMDSO) or dimethyldichlorosilane ($SiR_2Cl_2$), the electromagnetic radiation is provided at a first wavelength and at a first power, the substrate processing region of the second substrate processing chamber is maintained at a pressure between 1 Torr and 600 Torr during the third period of time, and the patterned substrate is maintained at a temperature of between 150° C. and 500° C. during the third period of time.

2. The method of claim 1, wherein the silicon and carbon containing precursor has a Si-O:Si ratio of less than 3.

3. The method of claim 1, wherein the radical-oxygen precursor comprises $O_2$, $H_2O$, $O_3$, $H_2O_2$, $N_2O$, NO or $NO_2$.

4. The method of claim 1, wherein flowing the radical-oxygen precursor into the substrate processing region during the second period of time further comprises:

controlling the pressure in the substrate processing region of the first substrate processing chamber to a pressure between 0.5 Torr and 3.0 Torr; and controlling the temperature of the patterned substrate to a temperature of between 40° C. and 150° C.

5. The method of claim 1, wherein the patterned substrate comprises a metal selected from a group consisting of titanium (Ti), tantalum (Ta), tungsten (W), cobalt (Co), copper (Cu) and aluminum (Al).

6. The method of claim 1, wherein the patterned substrate comprises a material selected from a group consisting of BCTe, GeSiAsTe, GeAsSe, and SeAsGeSi.

7. The method of claim 1, wherein at least a portion of the patterned substrate comprises a material that comprises germanium, antimony and tellurium.

8. The method of claim 1, wherein
the first flow rate is between 0.25 grams per minute (g/min) and 3 grams per minute (g/min) and the first period of time is between 1 seconds and 600 seconds,
the second flow rate is between 100 sccm and 2000 sccm and the second period of time is between 1 second and 1800 seconds, and
the first wavelength is between 240 nm and 600 nm, and the third period of time is between 10 seconds and 30 minutes.

9. A method of forming a low-k flowable dielectric film over a trench formed on a surface of a patterned substrate, comprising:
delivering a silicon and carbon containing precursor at a first flow rate onto a surface of a patterned substrate disposed in a substrate processing region of a first substrate processing chamber for a first period of time and a second period of time;
flowing an oxygen-containing precursor into a remote plasma region of a plasma source while igniting a remote plasma to form a radical-oxygen precursor;
flowing the radical-oxygen precursor into the substrate processing region at a second flow rate after the first period of time has elapsed and during the second period of time;
transferring the patterned substrate from the first substrate processing chamber to a second substrate processing chamber after the second period of time has elapsed; and
exposing the silicon and carbon containing precursor to electromagnetic radiation in the second substrate processing chamber for a third period of time after the second period of time has elapsed, to form a low-k flowable dielectric film over a trench formed on the surface of the patterned substrate, wherein
the electromagnetic radiation is provided at a first wavelength and at a first power,
the substrate processing region of the second substrate processing chamber is maintained at a pressure between 1 Torr and 600 Torr during the third period of time, and
the patterned substrate is maintained at a temperature of between 150° C. and 500° C. during the third period of time.

10. The method of claim 9, wherein the silicon and carbon containing precursor has a Si-O:Si ratio of less than 3.

11. The method of claim 9, the silicon and carbon containing precursor comprises octamethylcyclotetrasiloxane (OMCTS) tetramethylcyclotetrasiloxane (TMCTS), hexamethyldisiloxane (HMDSO), tetramethyldisiloxane (TMDSO), dimethyldisiloxane (DMDSO) or dimethyldichlorosilane ($SiR_2Cl_2$).

12. The method of claim 9, wherein the radical-oxygen precursor comprises $O_2$, $H_2O$, $O_3$, $H_2O_2$, $N_2O$, NO or $NO_2$.

13. The method of claim 9, wherein flowing the radical-oxygen precursor into the substrate processing region during the second period of time further comprises:
controlling the pressure in the substrate processing region of the first substrate processing chamber to a pressure between 0.5 Torr and 3.0 Torr; and
controlling the temperature of the patterned substrate to a temperature of between 40° C. and 150° C.

14. The method of claim 9, wherein the patterned substrate comprises a metal selected from a group consisting of titanium (Ti), tantalum (Ta), tungsten (W), cobalt (Co), copper (Cu) and aluminum (Al).

15. The method of claim 9, wherein the patterned substrate comprises a material selected from a group consisting of BCTe, GeSiAsTe, GeAsSe, and SeAsGeSi.

16. The method of claim 9, wherein at least a portion of the patterned substrate comprises a material that comprises germanium, antimony and tellurium.

17. The method of claim 9, wherein
the first flow rate is between 0.25 grams per minute (g/min) and 3 grams per minute (g/min) and the first period of time is between 1 seconds and 600 seconds,
the second flow rate is between 100 sccm and 2000 sccm and the second period of time is between 1 second and 1800 seconds, and
the first wavelength is between 240 nm and 600 nm, and the third period of time is between 10 seconds and 30 minutes.

* * * * *